Dec. 27, 1960 W. J. POPOWSKY 2,966,630

DIRECT CURRENT STABILIZED AMPLIFIER

Filed April 21, 1955

INVENTOR.
WILLIAM J. POPOWSKY

BY Henry L. Hanson

ATTORNEY.

United States Patent Office 2,966,630 Patented Dec. 27, 1960

2,966,630

DIRECT CURRENT STABILIZED AMPLIFIER

William J. Popowsky, Philadelphia, Pa., assignor to Minneapolis-Honeywell Regulator Company, Minneapolis, Minn., a corporation of Delaware Filed Apr. 21, 1955, Ser. No. 502,797

6 Claims. (Cl. 330—9)

Figures 1, 2:
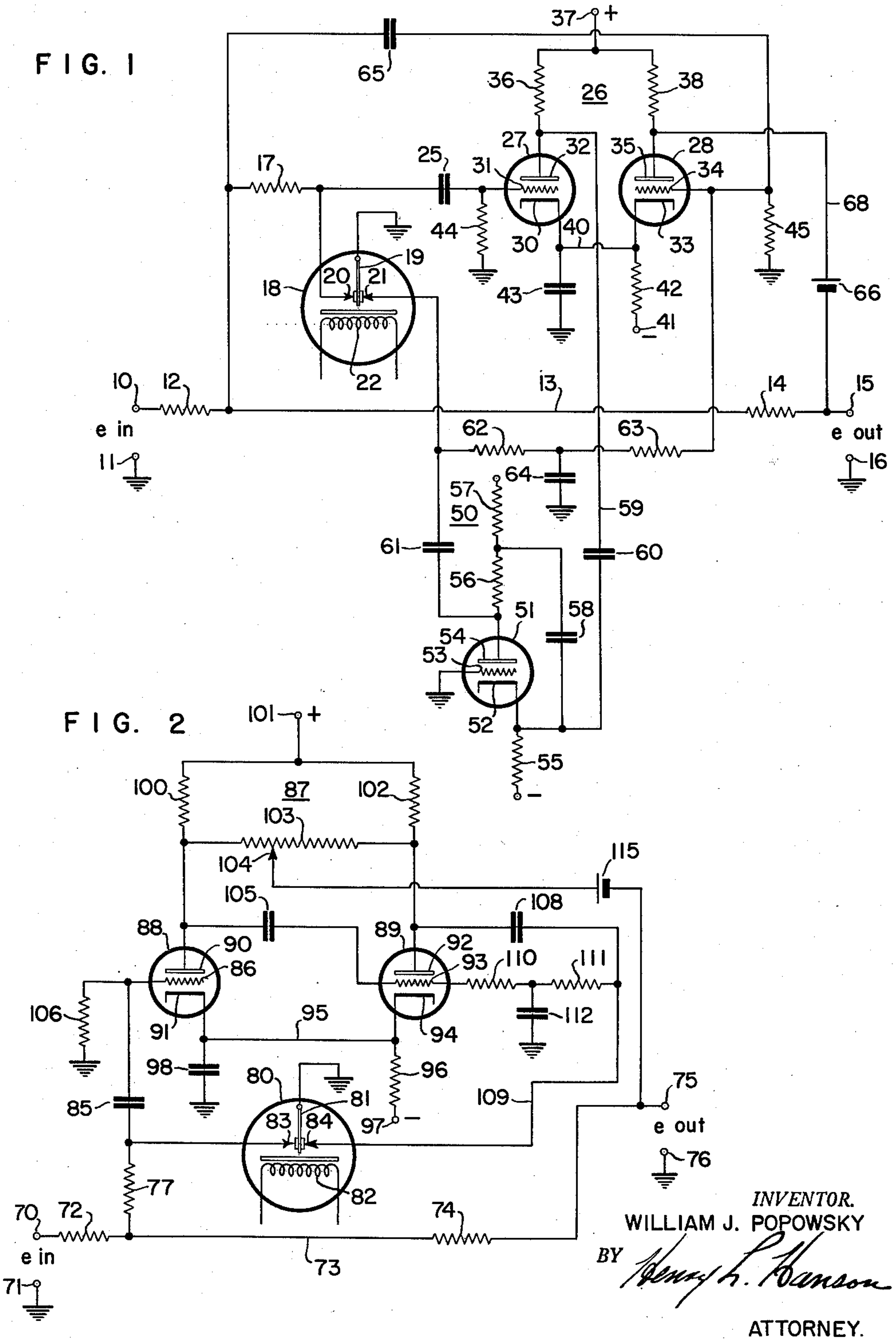

A general object of the present invention is to provide a new and improved electrical amplifier of the stabilized direct current type. More specifically, the present invention is concerned with an improved direct current stabilized amplifier which is characterized by its high gain, its high stability, and the utilization of a minimum number of components requred in the construction of the circuit.

In a copending application No. 502,937 of William F. Newbold entitled "Electrical Apparatus," and filed on even date herewith, there is disclosed an improved form of direct current amplifier of the stabilized type. The amplifier apparatus there disclosed comprises a differential amplifier wherein the differential amplifier is used to amplify both an alternating current signal and a direct current signal. The alternating current signal is derived from a signal converter which is connected to the amplifier input and converts an applied direct current signal into an alternating current signal for preliminary amplification. One section of the differential amplifier is used as an alternating current amplifier and the output of this amplifier is rectified and reapplied to the input of the same section of the differential amplifier. The present invention comprises an improvement providing overall operating characteristics superior to those obtained with the amplifier disclosed in the Newbold application, particularly in the area of increased transient and frequency response.

It is accordingly a further object of the invention to provide a new and improved direct current stabilized amplifier which exhibits improved transient and frequency response characteristics.

According to the present invention, the improved frequency and transient response characteristics are obtained by applying the alternating current signal and the derived direct current signal to separated points in the differential amplifier. Specifically, the alternating current signal is applied to the input of one section of the differential amplifier and the direct current signal derived from the amplified alternating current is applied to the other section of the differential amplifier.

It is therefore a further object of the present invention to provide an improved stabilized direct current amplifier using a differential amplifier with two amplifying sections, one of which has as its input an alternating signal derived from the signal converter and the other of which has an amplified direct current applied thereto by a signal conversion means.

In the apparatus disclosed in the aforementioned Newbold application, the alternating signal is amplified by one section only of the differential amplifier and also by a further stage of amplification which is independent of the differential amplifier. The present invention is arranged in one form so that both stages of the differential amplifier are used for amplifying the alternating current signal prior to its rectification and reapplication to the differential amplifier for direct current amplification.

Still another object is therefore to provide a stabilized direct current amplifier employing a pair of amplifying sections, both of which are utilized to amplify an alternating current signal derived from the direct current input and are again utilized in the amplifying of a converted alternating current.

In another version of the amplifier wherein a single section of the differential amplifier is used for amplifying the alternating current signal in the circuit, it has been found desirable to provide a high impedance amplifying stage which would produce no phase inversion of the applied signal and yet provide sufficient gain to increase the gain of the overall combination. This has been achieved by a special type of grounded control electrode amplifier having a cathode input and a condenser signal shunting circuit which enhances the impedance characteristics of the stage without deterring from the amplifier gain.

It is therefore a still further object of the present invention to provide a high impedance alternating current amplifier device having no phase inversion in the amplified alternating current signal.

The various features of novelty which characterize the invention are pointed out with particularity in the claims annexed hereto and forming a part of the specification. For a better understanding of the invention, its advantages, and specific objects attained with its use, reference should be had to the accompanying drawings and descriptive matter in which there is illustrated and described preferred embodiments of the invention.

Of the drawings:

Fig. 1 shows one form of the present apparatus utilizing a differential amplifier with only one section of the differential amplifier used for alternating current amplification; and Fig. 2 shows a modified form of the present invention wherein both stages of the differential amplifier are used to amplify the alternating current used in the amplifying circuit.

Referring first to Fig. 1, the numerals 10 and 11 represent a pair of input electrical terminals which are adapted to be connected to a direct current signal source. In series with the terminal 10 is a summing resistor 12. The right end of the resistor 12 is connected by way of a lead 13 to a feedback resistor 14, the latter of which is in series with an output terminal 15. The output terminal 15 cooperates with another output terminal 16 to form the output circuit for the present apparatus. Connected to the lead 13 on the input of the amplifying apparatus is a resistor 17 which has its opposite end connected to a vibratory type of signal converter 18. The converter 18 comprises a movable switch blade 19 which is adapted to be alternately switched between a pair of fixed contacts 20 and 21 by means of a driving coil 22.

The output signal from the contact 20 of the converter 18 is applied through a condenser 25 to the input of a differential amplifier 26. This differential amplifier comprises a pair of triode devices 27 and 28. The triode device 27 comprises a cathode 30, a control electrode 31, and an anode 32. The triode device 28 comprises a cathode 33, a control electrode 34, and an anode 35. A resistor 36 connects the anode 32 to a power supply terminal 37. Likewise, a resistor 38 connects the anode 35 to the supply terminal 37.

The cathodes 30 and 33 are joined together by a lead 40 and are connected to a further supply terminal 41 by a resistor 42. The cathode resistor 42 is arranged to be bypassed to ground by a condenser 43.

A resistor 44 acts as a grid leak resistor for the control electrode 41 while a resistor 45 acts as a grid leak resistor for the control electrode 34.

An auxiliary amplifying stage 50 comprises a triode amplifying device 51 having a cathode 52, a control electrode 53, and an anode 54. The cathode 52 is connected by way of a resistor 55 to one terminal of a power supply source and the anode 54 is connected to the other terminal of a power supply source by means of a pair of series connected resistors 56 and 57. A condenser 58 is connected between the junction of the resistors 56 and 57 and the cathode 52. The input circuit to the triode 51 is to the cathode 52 and is supplied by way of the lead 59 and a blocking condenser 60. The output from the triode 51 is taken from the anode 54 and fed through a blocking condenser 61 to the contact 21 of the signal conversion unit 18.

The output from the signal conversion unit 18, insofar as the blade 19 and contact 21 is concerned, is by way of a filter section comprising a pair of series connected resistors 62 and 63 and a condenser 64. A high frequency bypass condenser 65 is connected between the lead 13 and control electrode 34. A battery 66 is used to suppress the quiescent anode voltage in the differential amplifier.

*Operation of Fig. 1*

In considering the operation of Fig. 1, it is first assumed that there is a direct current input signal applied to the input terminals 10 and 11. This direct current input signal will pass through the summing resistor 12 and resistor 17 to contact 20 of the signal converter 18. The direct current potential on the contact 20 will be periodically grounded by the vibrating switch blade 19 engaging contact 20. This will result in an alternating current signal being produced on the right end of the resistor 17 and the same will be passed through the condenser 25 to the control electrode 31 of the differential amplifier 26. The triode 27 will act as an A.C. amplifier, due to the presence of the condenser 43 connected in the cathode circuit to bypass alternating current, and there will be an amplified alternating current signal appearing upon the anode 32. This amplified signal is coupled by way of lead 59 and condenser 60 to the second alternating current amplifier stage 50.

The amplifier stage 50 has its input on the cathode 52 and has its control electrode 53 grounded. With this configuration, there will be no phase inversion of an output signal taken from the anode 54. The normal grounded grid amplifying stage has a low input impedance. However, due to the presence of the condenser 58 which is connected between the junction of the resistors 56 and 57 and the cathode 52, the overall stage input impedance is greatly increased. The presence of the condenser 58 causes the input impedance to effectively be the impedance of resistor 57 and resistor 55 connected in parallel. The condenser 58 also acts to prevent the flow of the output electrical current through the resistor 55 so that in effect the output current is flowing through the triode 51, condenser 58, and resistor 56 in a closed series circuit. This is particularly useful as a voltage amplifier where the output signal does not flow through the input resistor 55.

The output from the anode 54 is coupled by way of the condenser 61 to the fixed contact 21 of the signal converter 18. The blade 19, in periodically grounding the contact 21, serves to produce a series of direct current pulses on the input of the filter comprised of the resistors 62 and 63 and the condenser 64. The filter section will have on its output terminals on the right end of the resistor 63 a direct current potential which will be proportional to the amplitude of the amplified alternating current signal and of a polarity dependent upon the phasing of the amplified alternating current signal. The output from the filter resistor 63 is applied to the control electrode 34 of the triode 28. This direct current signal will be amplified by the triode 28 and the output signal from the triode will be taken from the anode 35 by way of lead 68 to the output terminal 15. The amplified signal on terminal 15 will be applied back to the feedback summing resistor 14 to lead 13 to balance the input electrical signal. In the event that there is not a balance of the input signal so as to indicate zero potential on the lead 13, there will be a further input to the signal converter 18 and the apparatus will operate in the manner above described to produce a larger output signal to eliminate the deviation or error signal indicated on the lead 13.

Regardless of the polarity of the input signal applied to the input terminals 10 and 11, the amplifier will produce a corresponding balancing and amplified output signal on the output terminals 15 and 16. A deviation caused by drifting in the amplifier will in effect be cancelled and eliminated by the amplifier by its producing an output signal to correct for any drifting or deviation.

*Figure 2*

The apparatus shown in Fig. 2 is of the same general type as that shown in Fig. 1 with the exception that both amplifying sections of the differential amplifier are arranged to amplify the applied alternating current signal.

In this figure, numerals 70 and 71 represent the electrical input terminals to the amplifier of the apparatus. In series with the input terminal 70 is a resistor 72, the latter of which connects to a lead 73. The lead 73 is also connected to a resistor 74 which is the feedback summing resistor connected to a pair of output terminals 75 and 76. Also connected to the lead 73 is a resistor 77 whose upper terminal is connected to a signal conversion unit 80. The signal conversion unit is of the vibratory type and comprises a vibrating switch blade 81 driven by a coil 82 to alternately contact a pair of fixed contacts 83 and 84.

The upper end of the resistor 77 is also connected by way of a condenser 85 to the input control electrode 86 of the differential amplifier 87. The differential amplifier 87 comprises a pair of triode devices 88 and 89. The triode 88 comprises an anode 90, and a cathode 91, in addition to the control electrode 86. The triode 89 comprises an anode 92, control electrode 93, and a cathode 94. The cathodes 91 and 94 are connected together by a lead 95 and are furthert connected by a resistor 96 to a negative power supply terminal 97. A condenser 98 is connected to bypass to ground alternating current signals appearing on the lead 95.

The anode 90 is connected by way of a resistor 100 to a positive power supply terminal 101 while the anode 92 is connected by way of a resistor 102 to the same power supply terminal 101. A potentiometer slidewire resistor 103 is connected between the anodes 90 and 92 and the slidewire resistor 103 has a cooperating slider 104. A condenser 105 serves to couple the anode 90 to the control electrode 93 insofar as alternating current signals are concerned. The control electrode 86 has a grid leak resistor 106 connected thereto.

The output of the differential amplifier insofar as alternating current is concerned is coupled to the converter 80 by way of a condenser 108 and lead 109. The direct current signal produced by the converter 80, on its contact 84 and blade 81, is applied to the control electrode 93 by way of the lead 109 and a filter comprising a pair of series resistors 110 and 111 and a filter condenser 112. A battery 115 is used to suppress the quiescent anode voltage in the differential amplifier insofar as the output terminals 75 and 76 are concerned.

*Operation of Fig. 2*

Considering the operation of Fig. 2, it is assumed that there has been applied a direct current input signal to the input terminals 70 and 71. This direct current input signal will be applied through the summing resistor 72 and resistor 77 to the contact 83 of the signal conversion unit 80. The periodic engagement of the switch blade 81 with the contact 83 will ground the contact and create on the upper end of the resistor 77 a pulsating direct current signal. This pulsating direct current signal is passed through the condenser 85 to the control electrode 86. The applied alternating current signal will be amplified by the triode section 88 and coupled through the condenser 105 from the anode 90 to the control electrode 93 of the triode 89. The triode 89 will in turn further amplify the alternating signal and the signal will be coupled out from the anode 92 through the condenser 108 to the signal conversion unit 80 at contact 84. As the blade 81 periodically engages the contact 84, there will be produced on lead 109 a series of direct current pulses whose amplitude and polarity will be dependent upon the amplitude and phase of the applied electrical signal. The direct current pulses will be passed through the filter 110—112 to the control electrode 93 where it will appear as a direct current signal. The direct current signal will be amplified by the triode section 89 in the differential amplifier 87 acting in its normal capacity as a direct current amplifier. The output signal from the differential amplifier will produce a signal on the resistor 103 which is coupled between the anodes 90 and 92 and a selected portion of that signal will be picked off by the slider 104 which leads directly to the output terminal 75. The slider 104 is positioned at a point of zero A.C. signal. This results in a negligible sacrifice in circuit gain. The signal on the output terminal 75 will be fed back through the summing feedback resistor 74 to cancel the input signal on the lead 73. As with the amplifier shown in Fig. 1, if the output of the amplifier is not sufficient to balance the output signal on the lead 73, there will be a further amplification of the applied signal and the output signal will increase until there is a balance or null signal on the lead 73.

It will be apparent from the foregoing description that the differential amplifier 87 has been used in a dual capacity of an alternating current amplifier as well as a direct current amplifier. It should be noted that the use of the amplification stages first for A.C. amplification, then for D.C. amplification is tantamount to using additional stages for the D.C. amplification without the use of additional tubes or the like. This has been achieved without a sacrifice of gain or a sacrifice of sensitivity and stability. Further, as with Fig. 1, the alternating current input to the differential amplifier has been isolated from the direct current input to the differential amplifier to further enhance the frequency response and transient response of the overall circuit.

While, in accordance with the provisions of the statutes, there has been illustrated and described the best forms of the invention known, it will be apparent to those skilled in the art that changes may be made in the forms of the apparatus disclosed without departing from the spirit of the invention as set forth in the appended claims and that in certain cases certain features of the invention may be used to advantage without a corresponding use of other features.

Having now described the invention, what is claimed as new and for which it is desired to secure Letters Patent is:

1. An electrical amplifier comprising a pair of amplifying devices each having an input electrode, an output electrode and a common electrode, a resistor connected as a common element in the circuit of both of said common electrodes, an alternating current by-pass capacitor connected in shunt with said common resistor whereby said pair of amplifying devices may be operated independently for alternating current signals and present a differential response to applied direct current signals, a direct current signal input circuit, a signal converter, means connecting said converter to said input circuit to convert direct current signals from said input circuit into alternating current signals, means including direct current isolating means connecting said converter to the input electrode of one of said amplifying devices to apply said alternating current signals thereto, means connecting said input electrode of said one device to a point of fixed reference potential for direct current conditions, rectifying means, coupling means connecting said rectifying means to the output of said one of said amplifying devices to produce a second direct current signal, connection means for applying said second direct current signal to the input electrode of the other of said amplifying devices for differential amplification by said pair of amplifying devices, and a direct current output circuit connected to the output electrode of said other of said amplifying devices.

2. The invention as set forth in claim 1 wherein said coupling means includes means providing additional amplification of said alternating current signal.

3. The invention as set forth in claim 2 wherein said means providing additional amplification of said alternating current signal comprises the other of said amplifying devices.

4. The invention as set forth in claim 2 wherein said means providing additional amplification of said alternating current signal comprises a circuit including a third amplifying device.

5. The invention as set forth in claim 4 wherein said circuit including said third amplifying device comprises a triode having an anode, a cathode, and a control electrode, means connecting said control electrode to a point of fixed reference potential, a resistor connecting said cathode to one terminal of a power source, a pair of series connected resistors connecting said anode to the other terminal of said power source, a condenser connected between the junction of said series resistors and said cathode, means connecting an input signal from the output of said one amplifying device to said cathode, and output means connecting said anode to said rectifying means.

6. A stabilized direct current amplifier including two amplifying devices each of which has an anode, a cathode and a control electrode, a resistor connected as a common element in the cathode circuit of both of said amplifying devices for connecting said cathodes to source of potential, an alternating current by-pass capacitor for said resistor whereby said two amplifying devices may be operated independently of each other for alternating current signals and present a differential response for direct current signals, a pair of anode resistors one connected between the anodes of each of said devices and a potential source terminal, a direct current signal input circuit, means for converting input direct current signals from said input circuit into alternating current signals, means including direct current isolating means for applying said alternating current signals to the control electrode of one of said amplifying devices, means connecting said control electrode of said one of said devices to a point of fixed reference potential for direct current conditions, alternating current coupling means coupling the anode of said one of said devices to the control electrode of the other of said devices, rectifying means, alternating current coupling means connecting the anode of said other of said devices to said rectifying means, direct current connection means connecting the output of said rectifying means to said control electrode of said other of said amplifying devices, and a direct current output circuit connected between the anodes of said two amplifying devices.

References Cited in the file of this patent

UNITED STATES PATENTS

| | | |
|---|---|---|
| 2,459,730 | Williams | Jan. 18, 1949 |
| 2,600,120 | MacSorley | June 10, 1952 |
| 2,605,409 | Forbes | July 29, 1952 |
| 2,615,064 | Stanton | Oct. 21, 1952 |
| 2,619,552 | Kerns | Nov. 25, 1952 |
| 2,741,668 | Iffland | Apr. 10, 1956 |
| 2,743,325 | Kaiser et al. | Apr. 24, 1956 |
| 2,888,523 | Ross | May 26, 1959 |
| 2,896,027 | Smith | July 21, 1959 |